(12) United States Patent
Ewanchuk

(10) Patent No.: US 11,415,625 B2
(45) Date of Patent: Aug. 16, 2022

(54) DEVICE AND METHOD FOR MONITORING MULTI-DIE POWER MODULE

(71) Applicant: MITSUBISHI ELECTRIC CORPORATION, Tokyo (JP)

(72) Inventor: Jeffrey Ewanchuk, Rennes (FR)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 35 days.

(21) Appl. No.: 16/977,398

(22) PCT Filed: Jan. 31, 2019

(86) PCT No.: PCT/JP2019/004320
§ 371 (c)(1),
(2) Date: Sep. 1, 2020

(87) PCT Pub. No.: WO2019/187676
PCT Pub. Date: Oct. 3, 2019

(65) Prior Publication Data
US 2021/0011079 A1 Jan. 14, 2021

(30) Foreign Application Priority Data
Mar. 30, 2018 (EP) .................................. 18165304

(51) Int. Cl.
*G01R 31/28* (2006.01)
*G01R 31/26* (2020.01)
*G01R 31/27* (2006.01)

(52) U.S. Cl.
CPC ..... *G01R 31/2889* (2013.01); *G01R 31/2642* (2013.01); *G01R 31/275* (2013.01)

(58) Field of Classification Search
CPC ............ G01R 31/2608; G01R 31/2889; G01R 31/2621; G01R 31/2642; G01R 31/42; G01R 31/275; G01R 31/28; G01R 31/26; G01R 31/27; G01R 31/318511; G01R 31/2884; G01R 31/2831; G01R 31/318505; H01L 22/34
See application file for complete search history.

(56) References Cited

U.S. PATENT DOCUMENTS

| 7,215,590 B1* | 5/2007 | Borden | ..................... G11C 5/14 324/750.3 |
| 2007/0040571 A1 | 2/2007 | Dolian | |
| 2018/0145503 A1* | 5/2018 | Minagawa | ............ H02M 5/458 |

FOREIGN PATENT DOCUMENTS

WO  WO 2017/141545 A1  8/2017

* cited by examiner

*Primary Examiner* — Jermele M Hollington
*Assistant Examiner* — Suresh K Rajaputra
(74) *Attorney, Agent, or Firm* — Birch, Stewart, Kolasch & Birch, LLP

(57) ABSTRACT

A method and device for monitoring a multi-die power module in a half-bridge switch configuration are provided. The method and device are designed to set dies in a non conductive state, select one die which is blocking a voltage, inject a current in a gate of the selected die in order to charge an input parasitic capacitance of the selected die, monitor a voltage that is representative of a voltage on the gate of the selected die, and memorize the value of the monitored voltage when the value of the monitored voltage is stabilized.

8 Claims, 4 Drawing Sheets

DEVICE AND METHOD FOR MONITORING MULTI-DIE POWER MODULE

TECHNICAL FIELD

The present invention relates generally to a device and a method for on line monitoring a power semiconductor device.

BACKGROUND ART

The on-line health monitoring of power semiconductor devices requires the collection of data that are indicators of the state of health of power semiconductor devices.

Typically, much developmental effort has been devoted to the monitoring of the internal junction temperature, or the on-state voltage of the power semiconductor devices.

One critical, but often overlooked parameter, in voltage controlled power semiconductor devices, i.e. IGBTs or MOSFETs, is the threshold voltage.

While this parameter is required to be measured at the die level after manufacturing, it is also an indicator for failure mechanisms related to the gate oxide breakdown, due to gate overvoltage, high temperature operation or other gate stresses. Furthermore, the value of the threshold voltage is also important after the packaging of the die to ensure functionality in the finished product.

As the threshold voltage, Vth, is the voltage level at which the power semiconductor device begins to conduct current, several offline methods exist to measure this parameter.

At the defined threshold of current, the corresponding gate voltage is defined as the threshold voltage value. However, the presence of both the precise current measurement and the variable gate voltage makes on-line measurements challenging especially when costs are considered.

SUMMARY OF INVENTION

The present invention aims to provide an on-line monitoring method and device which decouples the measurement from the die commutation current timing, which is potentially cost prohibitive in a multi-die power module.

To that end, the present invention concerns a method for monitoring a multi-die power module comprising 2*N dies that are in a half-bridge switch configuration, characterized in that the method comprises the steps of:
  setting the dies in a non conductive state,
  selecting one die which is blocking a voltage,
  injecting a current in a gate of the selected die in order to charge an input parasitic capacitance of the selected die,
  monitoring a voltage that is representative of a voltage on the gate of the selected die,
  memorizing the value of the monitored voltage when the value of the monitored voltage is stabilized.

Thus, the threshold voltage of a single die among the dies of the power module may be measured by the method according to a voltage plateau value and without any measurement or synchronization of the collector current reducing then the cost of the implementation.

According to a particular feature, the monitoring of the voltage is executed after a first predetermined time period after the beginning the injecting of the current in the gate of the selected die, the first predetermined time period value is determined from a first reference voltage, the value of which is strictly inferior to the minimum value of the threshold voltages of the dies of the multi-die power module.

According to a particular feature, the method further comprises the step of checking if the monitoring of the voltage is executed during a second predetermined time period or if the monitored voltage is equal or superior to a maximum defined reference and if the monitoring of the voltage is not executed during the second predetermined time period or if the monitored voltage is equal or superior to the maximum defined reference, the method further comprises the step of notifying a fault of the die.

Thus, the user of the multi-die power module is able to detect the faults on the power die and may estimate the kind of fault of the die. Based on such information, the user is able to judge to continue or not the operation of the power module in a degraded mode in order to fulfill a critical mission/operation.

According to a particular feature, the dies are divided into a first and a second groups and in that once the present algorithm is executed for a die of one group, the present algorithm is executed for a die of the other group.

Thus, the measurements may alternate between the two groups of dies continually. The threshold voltage of all dies composing the power module may be measured in situ without any intervention or an external command.

The present invention concerns also a device for monitoring a multi-die power module comprising 2*N dies that are in a half-bridge switch configuration, characterized in that the device comprises:
  means for setting the dies in a non conductive state,
  means for selecting one die which is blocking a voltage,
  means for injecting a current in a gate of the selected die in order to charge an input parasitic capacitance of the selected die,
  means for monitoring a voltage that is representative of a voltage on the gate of the selected die,
  means for memorizing the value of the monitored voltage when the value of the monitored voltage is stabilized.

Thus, the threshold voltage of a single die among the dies compositing the power module may be measured by the device according to a voltage plateau value and without any measurement or synchronization of the collector current reducing then the cost of the implementation.

According to a particular feature, the monitoring of the voltage is executed after a first predetermined time period after beginning of the injecting of the current in the gate of the selected die, the first predetermined time value is determined from a first refence voltage, the value of which is strictly inferior to the minimum value of the threshold voltages of the dies of the multi-die power module.

According to a particular feature, the device further comprises means for checking if the monitoring of the voltage is executed during a second predetermined time period or if the monitored voltage is equal or superior to a maximum defined reference and the device activates means for notifying a fault of the die if the monitoring of the voltage is not executed during the second predetermined time period or if the monitored voltage is equal or superior to the maximum defined reference.

Thus, the device informs the user of the power module the fault detection on the power die and estimates the kind of fault of the die. Based on such information, the user is able to judge to continue or not the operation of the power module in a degraded mode in order to fulfill a critical mission/operation.

According to a particular feature, the dies are divided into a first and a second groups and once the device has monitored one die of one group, the device monitors a die of the other group.

Thus, the device may alternate the measurements between the two groups of dies continually and acquire the threshold voltage of all dies composing the power module in situ without any intervention or an external command.

The characteristics of the invention will emerge more clearly from a reading of the following description of example embodiments, the said description being produced with reference to the accompanying drawings.

DESCRIPTION OF EMBODIMENTS

Figure 1:
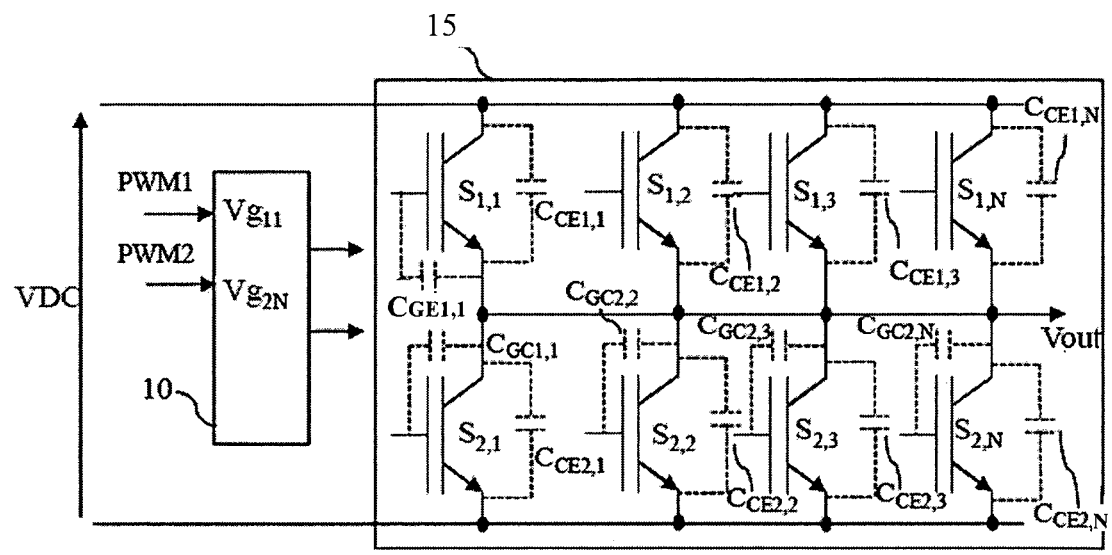
FIG. 1 represents an example of a system comprising a multi-die power module and a multi-die monitoring device according to the present invention.

FIG. 1 represents an example of a system comprising a multi-die power module and a multi-die monitoring device according to the present invention.

The multi-die power module 15 comprises 2*N dies noted $S_{1,1}$, to $S_{1,N}$, $S_{2,1}$ to $S_{2,N}$. The dies of the multi-die power module 15 are in a half-bridge switch configuration i.e. in a classical operation mode, when the dies $S_{1,1}$, to $S_{1,N}$ are conducting, the dies $S_{2,1}$ to $S_{2,N}$ are not conducting and reciprocally.

The multi-die monitoring device 10 receives input signal PWM1 and PWM2 and drives the dies $S_{1,1}$, to $S_{1,N}$ and $S_{2,1}$ to $S_{2,N}$ through amplifiers not shown in FIG. 1.

More precisely, during normal operation, the multi-die monitoring device 10 drives the dies $S_{1,1}$, to $S_{1,N}$ using signal PWM1 and drives the dies $S_{2,1}$, to $S_{2,N}$ using signal PWM2.

The present invention uses the stored charge in the parasitic output capacitance of the dies as a means to measure the threshold voltage of the dies in a half-bridge configuration. The parasitic output capacitance is the sum of the parasitic capacitance between the collector and the gate of a die and of the parasitic capacitance between the collector and the emitter of said die. During a certain on-line condition, the dies S1,i with i=1 to N, in the half-bridge are blocking the DC voltage VDC, with a preferred small or zero load current, Iout, going through Vout. For example the load current is lower than 1 Ampere. Then, a DC current is injected through the gate of a single die S1,i with i=1 to N, the opposite dies S2,1 to S2,N and the dies S1,1 to S1,i−1 and to S1,i+1 to S1,N are non-conductive. The injected DC current charges the gate to emitter capacitance of the die S1,i and the energy stored in the internal output parasitic capacitance of the die S1,1 to S1,N are discharged into the output capacitance of the dies S2,1 to S2,N. During the discharge of this energy, the collector-emitter voltage transitions across the dies S1,1 to S1,N, consequently the transitions of the voltage of the dies S2,1 to S2,N cause a transition in the gate voltage waveform of the die S1,i that plateaus around the threshold voltage. A synchronized sampling instant occurs in accordance with the gate signal, and the value of the plateau in the gate voltage is measured. The technique is extended to the multi-die systems by alternating the DC current injection pulse from the upper dies S1,1, to S1,N and lower dies S2,1, to $S_{2,N}$.

Furthermore, as the gate plateau time is related to the transition of the die $S_{1,i}$ under test from blocking a large to low voltage according to the conducted current, the time to transition is large due to the small magnitude of the current conducted. This improves the time available for measurement of the threshold voltage, and minimizes the cost of implementation.

The present invention requires a half-bridge configuration, but does not require any measurement of the collector current, Ic, at the power terminal of the dies to trigger the measurement of the threshold voltage.

A further enhancement of the present invention is to employ identical measurement chains with DC current injection circuits to reduce the cost of implementation.

The multi-die power module 15 comprises two groups of dies noted $S_{1,1}$, to $S_{1,N}$ and $S_{2,1}$, to $S_{2,N}$. The first group of dies comprises the dies $S_{1,1}$, to $S_{1,N}$. The second group of dies comprises the dies $S_{2,1}$, to $S_{2,N}$. The collectors of the dies $S_{1,1}$, to $S_{1,N}$ are connected in parallel to a positive terminal of a power supply and the emitters of the dies $S_{1,1}$, to $S_{1,N}$ are connected respectively to the collectors of the dies $S_{2,1}$, to $S_{2,N}$ and provide a signal Vout to a load not shown in FIG. 1. The emitters of the dies $S_{2,1}$, to $S_{2,N}$ are connected in parallel to a negative terminal of the power supply. For each die $S_{1,1}$, to $S_{1,N}$, $S_{2,1}$ to $S_{2,N}$, a diode, not shown in FIG. 1 for the sake of clarity, is connected between the emitter and the collector of the die. More precisely, the anode of the diode is connected to the emitter of the die and the cathode of the diode is connected to the collector of the die.

According to the present invention, the multi-die monitoring device comprises:
  means for setting the dies in a non conductive state,
  means for selecting one die which is blocking a voltage,
  means for injecting a current in a gate of the selected die in order to charge an input parasitic capacitance of the selected die,
  means for monitoring a voltage that is representative of a voltage on the gate of the selected die,
  means for memorizing the value of the monitored voltage when the value of the monitored voltage is stabilized.

Figure 2:
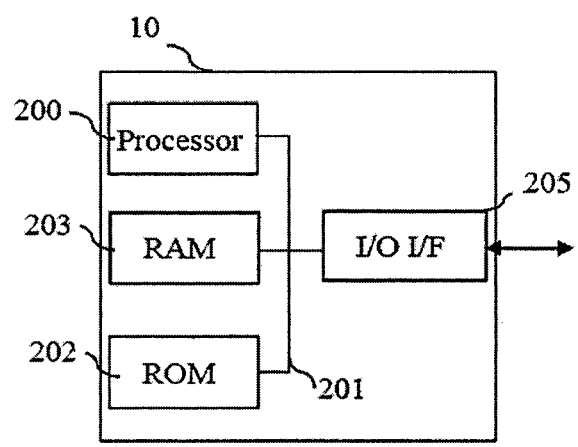
FIG. 2 represents an example of an architecture of the multi-die monitoring device according to the present invention.

FIG. 2 represents an example of an architecture of the multi-die monitoring device according to the present invention.

Figure 4:
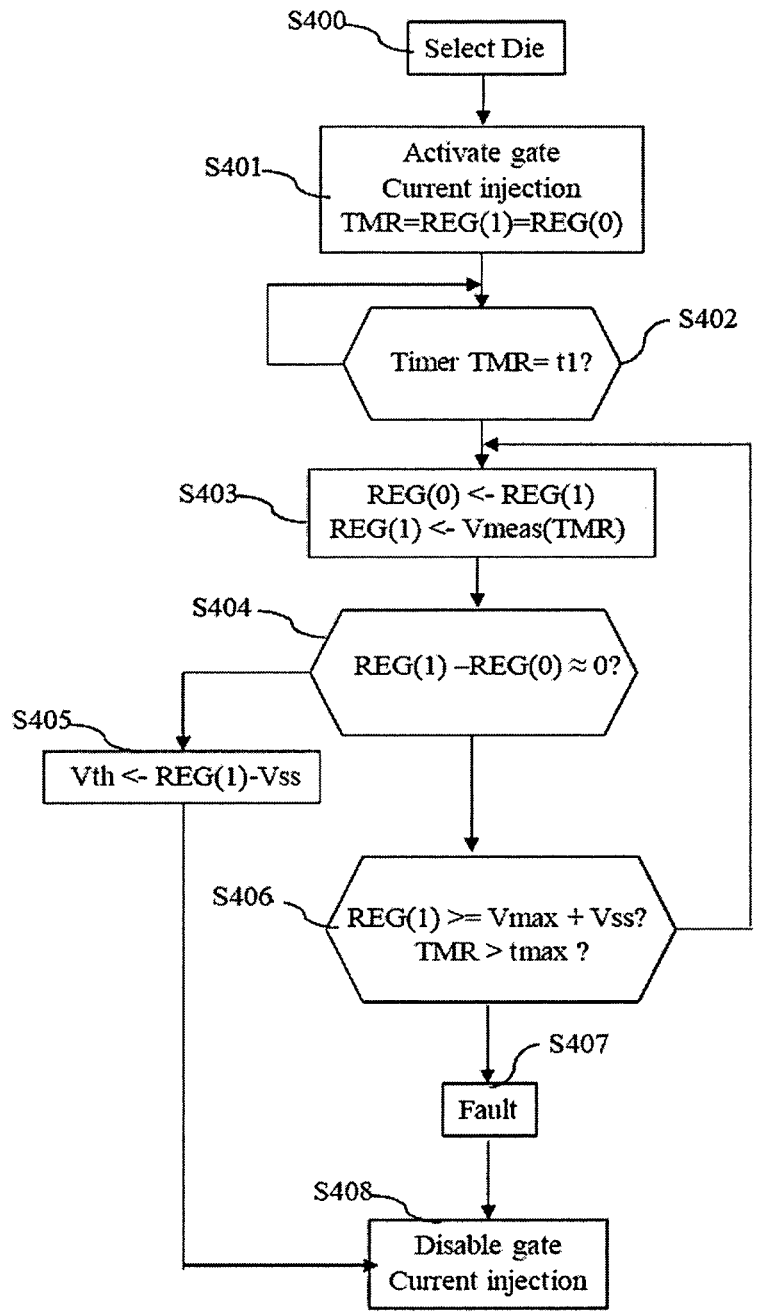
FIG. 4 represents an example of an algorithm for monitoring of a die of the multi-die power module according to the present invention.

The multi-die monitoring device 10 has, for example, an architecture based on components connected together by a bus 201 and a processor 200 controlled by a program as disclosed in FIG. 4.

The bus 201 links the processor 200 to a read only memory ROM 202, a random access memory RAM 203 and an input output I/O IF interface 205.

The memory 203 contains registers intended to receive variables and the instructions of the program related to the algorithm as disclosed in FIG. 4.

The processor 200 receives through the input output I/O IF 205 PWM1 and PWM2 signals and output gate voltages $Vg_{j,i}$ for the dies $S_{j,i}$ with i=1 to N and j=1 or 2 and injects a current Im into each die $S_{j,i}$.

The read-only memory, or possibly a Flash memory 202, contains instructions of the program related to the algorithm as disclosed in FIG. 4, when the multi-die monitoring device 10 is powered on, to the random access memory 203.

The multi-die monitoring device 10 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the multi-die monitoring device 10 includes circuitry, or a device including circuitry, enabling the multi-die monitoring device 10 to perform the program related to the algorithm as disclosed in FIG. 4.

Figure 3:
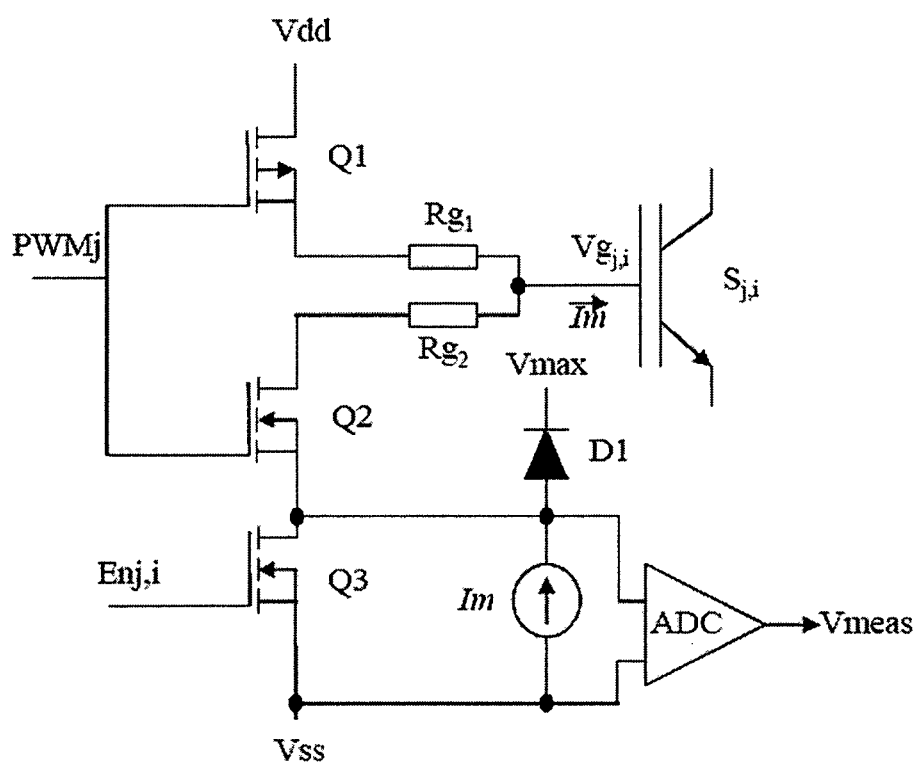
FIG. 3 represents an example of an input output interface of the multi-die monitoring device according to the present invention.

FIG. 3 represents an example of an input output interface of the multi-die monitoring device according to the present invention.

The input output interface 205 comprises, for each die, three transistors Q1 to Q3, two resistors Rg1 and Rg2, a diode D1, an analogue to digital convertor ADC and a current source Im.

In a variant, the diode D1, the analogue to digital convertor ADC and the current source Im may be the same for the dies $S_{1,1}$ to $S_{1,N}$ and another diode, another analogue to digital convertor and another current source may be mutualised for the dies $S_{2,1}$ to $S_{2,N}$ using an analogue multiplexor in order to reduce the cost of implementation.

The transistor Q1 is a P type MOSFET and the transistors Q2 and Q3 are N type MOSFET.

The source of transistor Q1 is connected to a positive power supply Vdd. The drain of transistor Q1 is connected to a first terminal of the resistor $Rg_1$.

A second terminal of resistor $Rg_1$ is connected to a first terminal of resistor $Rg_2$ and to the gate of die $S_{j,i}$.

A second terminal of resistor $Rg_2$ is connected to the drain of transistor Q2.

The source of transistor Q2 is connected to the drain of transistor Q3, to the anode of the diode D1, to a positive terminal of the current source Im and to an input of the analogue to digital converter ADC.

The source of transistor Q3 is connected to a negative power supply Vss, to a negative terminal of the current source Im and to an input of the analogue to digital converter ADC.

The gates of transistors Q1 and Q2 are connected to the signal PWMj.

The gate of transistor Q3 is connected to a signal Enj,i that enables the current injection into the gate of the die $S_{j,i}$.

The cathode of the diode D1 is connected to a reference voltage Vmax.

FIG. 4 represents an example of an algorithm for monitoring a die of the multi-die power module according to the present invention.

The present algorithm is disclosed in an example wherein it is executed by the processor 200.

At step S400, the processor 200 selects a die to monitor, for example the die $S_{1,1}$.

The dies $S_{1,2}$ to $S_{1,N}$ and $S_{2,1}$ to $S_{2,N}$ are not conducting.

At next step S401, the processor 200 activates the current injection into the gate of the die $S_{1,1}$ by setting the signal $En_{1,1}$ to high level and PWM1 to low level.

According to the present invention, a current with a magnitude of Im, which is typically on the order of 5-30 mA, is injected into the gate of one die $S_{1,1}$, when it is in the off-state, and blocking the DC voltage VDC. The parasitic input capacitance, Cies, is the sum of the parasitic capacitance between the collector and the gate of a die and of the parasitic capacitance between the gate and the emitter of a die. Once the current injection begins, the gate voltage $Vge_{1,1}$ increases according to the parasitic input capacitance, $Cies_{1,1}$ of the die $S_{1,1}$, and the time, according to the following formula:

$$Vge_{1,1}(t) = \frac{I_m}{Cies_{1,1}} \cdot t$$

Figure 5:
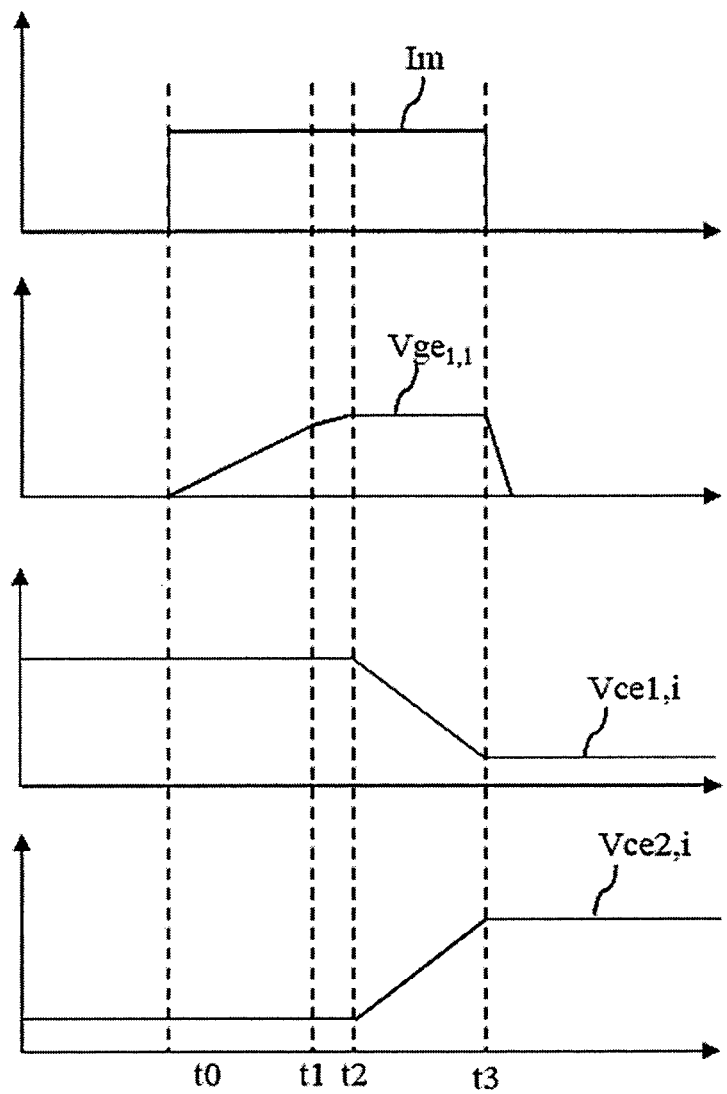
FIG. 5 represents the signals used for monitoring the multi-die power module according to the present invention.

The current injection starts at t0 in FIG. 5.

FIG. 5 represents the signals used for monitoring the multi-die power module according to the present invention.

In FIG. 5, the injection current Im, the gate voltage $Vge_{1,1}$, corresponding to the voltage of gate to emitter of die $S_{1,1}$, the voltages $Vce_{1,i}$, corresponding to the collector-emitter voltage of dies $S_{1,1}$ to $S_{1,N}$ and $Vce_{2,i}$, corresponding to the collector-emitter voltage of dies $S_{2,1}$ to $S_{2,N}$ are represented.

At the same step, the processor 200 initializes the counter 'TMR' and two memory registers for storage 'REG(1)' and 'REG(0)' are set to zero.

At next step S402, the processor 200 checks if the timer TMR is equal to a first predetermined time value t1.

At the clock frequency of the processor 200, the timer 'TMR' increases until the first predetermined time value t1. The first predetermined time value t1 is based on a first refence voltage $V_1$, which value is strictly inferior to the minimum value of the threshold voltage of the die given in the die datasheet and the time to charge the input capacitance to this voltage based on the injected measurement current. An example of calculation of the first predetermined time value 't1' equal to 1 μs, based on a reference IGBT module with a capacitance value $Cies_{1,1}$=15 nF, a measurement current of 30 mA, a negative power supply Vss=0V and a first reference voltage $V_1$=2V is shown in:

$$I_m = Cies_{11} \cdot \frac{\Delta V}{\Delta t} \rightarrow t_1 = C_{GEj,i} \cdot \frac{V_1}{I_m} \rightarrow t_1 = 1 \ \mu s$$

When the threshold voltage, Vth, is reached, the die $S_{1,1}$ begins to conduct, discharging the stored energy in the parasitic output capacitances $C_{GC1,1}$ to $C_{GC1,N}$, $C_{CE1,1}$ to $C_{CE1,N}$ of the dies $S_{1,i}$ in to the parasitic output capacitances $C_{GC2,1}$ to $C_{GC2,N}$, $C_{CE2,1}$ to $C_{CE2,N}$ of the dies $S_{1,1}$ to $S_{1,N}$ in the half-bridge. As the gate voltage is only slightly above the threshold voltage, the saturation current (Is) in the die $S_{1,1}$ is low thereby limiting the peak collector current, Ic, in the die $S_{1,1}$ to a low value. This stage corresponds to time t1 in FIG. 5.

When the time TMR is equal to t1, the processor 200 moves to step S403.

After t1, the analogue to digital converter ADC begins a continuous sampling.

At step S403, the processor 200 sets the content of register REG(1) in the register REG(0) and stores the sampled value of Vmeas in register REG(1). Note the value of the sampled value Vmeas is close to the value of $Vge_{1,1}$ plus Vss.

When the voltage $Vge_{1,1}$ achieves the threshold voltage, the die output parasitic capacitances $C_{oes1,1}$ to $C_{oes1,N}$ of the dies $S_{1,2}$ to $S_{1,N}$ start discharging, the voltage across the die $S_{1,1}$, causing a displacement current to flow into the input parasitic capacitance of the gate of the die $S_{1,1}$.

Consequently, a plateau in the gate voltage waveform appears, corresponding to t2 in FIG. 5. As the saturation current is low, the plateau voltage is roughly equivalent to the threshold voltage value, according to the following equation:

$$V_{qs1,1} = V_t + \frac{I_s + I_{out}}{g_{fs}} \sim V_t \text{ when } I_s \sim 0 \text{ and } I_{out} \sim 0$$

Where $g_{fs}$ is the transconductance value of the die and $I_{out}$ is the current flowing through Vout.

In this case, if a sample of the gate voltage was made, the measured value is close to the threshold voltage measurement of the die $S_{1,1}$. Furthermore, as the process is repeatable for a fixed temperature or compensate for temperature, the threshold voltage measurement can be digitally corrected to compensate for the actual difference.

The length of the plateau is related to the time to completely remove the charges stored in the parasitic output capacitances and hence, owing to the small current, Is plus $I_{out}$, used to discharge the output capacitances. The length of the plateau can be on the order of several micro-seconds enabling the use a low sampling rate frequency analogue to digital converter reducing the cost of the implementation.

At step S404, the processor 200 checks if the measured voltage Vmeas is stabilized by comparing the content of registers REG(1) and REG(0).

If the measured voltage Vmeas voltage is stabilized, the processor 200 moves to step S405, otherwise the processor 200 moves to step S406.

At step S405, the processor 200 sets the value in 'REG(1)' to the value of Vth, the threshold voltage and moves to step S408.

After the measured voltage Vmeas stabilizes, the current injection can be turned off, and the gate-emitter capacitance $C_{GE1,1}$ is discharged, corresponding to state t3 in FIG. 5. In this manner, the classical operation of the half-bridge may be reestablished.

The next threshold voltage measurement may occur in the opposite device, i.e. $S_{2,1}$, and measurements can be repeated indefinitely using the present algorithm.

At step S406, the processor 200 checks if the timer TMR is equal or superior to a maximum predetermined time value, $t_{max}$, and the voltage $V_{meas}$(TMR) stored in the register REG(1) is compared to a maximum defined reference, $V_{max}$.

If the timer TMR is superior to the maximum predetermined time value, $t_{max}$, or $V_{meas}$(TMR) is equal or superior to the maximum defined reference, $V_{max}$ the processor 200 moves to step S407. Otherwise, the processor 200 returns to step S403.

The maximum defined reference, $V_{max}$, is based of a critical limit for the measured threshold voltage and the maximum, i.e. 10V, for a die where the threshold voltage is typically 4-6V. The maximum predetermined time value $t_{max}$ is determined by the maximum defined reference, $V_{max}$. An example of calculation is given with a measurement current of 30 mA, a maximum reference voltage of $V_{max}$=10V, and a input capacitance of $Cies_{1,1}$=15 nF as:

$$t_{max} = C_{ies1,1} \cdot \frac{(V\max - V1)}{I_m} + t_1 \rightarrow t_2 = 5 \ \mu s$$

Hence, in the present example, the continuous sampling in the ADC is active for 4 μs.

At step S407 a fail flag is generated in order to inform that the measurement of threshold voltage of die $S_{1,1}$ is failed. In case the timer TMR is superior to the maximum predetermined time value, the fail indicates a fault in short circuit mode of the gate-emitter of die $S_{1,1}$. Otherwise, in case $V_{meas}$(TMR) is equal or superior to the maximum defined reference, $V_{max}$, the fail indicates a fault in open circuit mode of the gate-emitter or collector-emitter of die $S_{1,1}$.

Then, the processor 200 moves to step S408.

At step S408, the gate injection circuit is then disabled, and the gate is immediately discharged to allow for normal operation to commence.

Naturally, many modifications can be made to the embodiments of the invention described above without departing from the scope of the present invention.

The invention claimed is:

1. A method for monitoring a multi-die power module comprising 2*N dies that are in a half-bridge switch configuration, characterized in that the method comprises the steps of:
   setting the dies in a non conductive state,
   selecting one die which is blocking a voltage,
   injecting a current in a gate of the selected die in order to charge an input parasitic capacitance of the selected die,
   monitoring a voltage that is representative of a voltage on the gate of the selected die, the monitoring of the voltage is executed after a first predetermined time period after beginning the injecting of the current in the gate of the selected die, the first predetermined time period value is determined from a first reference voltage, the value of which is strictly inferior to the minimum value of the threshold voltages of the dies of the multi-die power module, and
   memorizing the value of the monitored voltage when the value of the monitored voltage is at a voltage plateau, wherein
   each of the threshold voltages corresponds to a voltage level at which a die of the multi-die power module begins to conduct current.

2. The method according to claim 1, characterized in that the method further comprises the step of checking if the monitoring of the voltage is executed during a second predetermined time period or if the monitored voltage is equal or superior to a maximum defined reference and if the monitoring of the voltage is not executed during the second predetermined time period or if the monitored voltage is equal or superior to the maximum defined reference, the method further comprises the step of notifying a fault of the die.

3. The method according to claim 1, characterized in that the dies are divided into a first and a second groups and in that once the method is executed for a die of one group, the method is executed for a die of the other group.

4. The method according to claim 2, characterized in that the dies are divided into a first and a second groups and in that once the method is executed for a die of one group, the method is executed for a die of the other group.

5. A device for monitoring a multi-die power module comprising 2*N dies that are in a half-bridge switch configuration, characterized in that the device comprises:
   a setter for setting the dies in a non conductive state,
   a selector for selecting one die which is blocking a voltage,
   an injector for injecting a current in a gate of the selected die in order to charge an input parasitic capacitance of the selected die,
   a monitor for monitoring a voltage that is representative of a voltage on the gate of the selected die, the monitoring of the voltage is executed after a first predetermined time period after beginning the injecting of the current in the gate of the selected die, the first predetermined time period value is determined from a first reference voltage, the value of which is strictly inferior to the minimum value of the threshold voltages of the dies of the multi-die power module, and a memory for memorizing the value of the monitored voltage when the value of the monitored voltage is at a voltage plateau, wherein each of the threshold voltages corresponds to a voltage level at which a die of the multi-die power module begins to conduct current.

6. The device according to claim 5, characterized in that the device further comprises a checker for checking if the monitoring of the voltage is executed during a second predetermined time period or if the monitored voltage is equal or superior to a maximum defined reference and the device is configured to activate a notifier for notifying a fault of the die if the monitoring of the voltage is not executed during the second predetermined time period or if the monitored voltage is equal or superior to the maximum defined reference.

7. The device according to claim 5, characterized in that the dies are divided into a first and a second groups and in that once the device has monitored one die of one group, the device is configured to monitor a die of the other group.

8. The device according to claim 6, characterized in that the dies are divided into a first and a second groups and in that once the device has monitored one die of one group, the device is configured to monitor a die of the other group.

* * * * *